(12) United States Patent
Talledo

(10) Patent No.: US 11,031,350 B2
(45) Date of Patent: Jun. 8, 2021

(54) LEADFRAME WITH PAD ANCHORING MEMBERS AND METHOD OF FORMING THE SAME

(71) Applicant: STMICROELECTRONICS, INC., Calamba (PH)

(72) Inventor: Jefferson Talledo, Calambra (PH)

(73) Assignee: STMICROELECTRONICS, INC., Calamba (PH)

( * ) Notice: Subject to any disclaimer, the term of this patent is extended or adjusted under 35 U.S.C. 154(b) by 28 days.

(21) Appl. No.: 16/223,582

(22) Filed: Dec. 18, 2018

(65) Prior Publication Data

US 2019/0198454 A1 Jun. 27, 2019

Related U.S. Application Data

(60) Provisional application No. 62/636,619, filed on Feb. 28, 2018, provisional application No. 62/610,488, filed on Dec. 26, 2017.

(51) Int. Cl.
| | |
|---|---|
| *H01L 23/00* | (2006.01) |
| *H01L 23/31* | (2006.01) |
| *H01L 23/495* | (2006.01) |
| *H01L 21/56* | (2006.01) |
| *H01L 21/48* | (2006.01) |

(52) U.S. Cl.
CPC ........ *H01L 23/562* (2013.01); *H01L 21/4825* (2013.01); *H01L 21/4828* (2013.01); *H01L 21/4842* (2013.01); *H01L 21/565* (2013.01); *H01L 23/3114* (2013.01); *H01L 23/4952* (2013.01); *H01L 23/49503* (2013.01); *H01L 23/49513* (2013.01); *H01L 23/49541* (2013.01); *H01L 23/49551* (2013.01)

(58) Field of Classification Search
CPC ......... H01L 23/49503; H01L 23/49551; H01L 21/4828; H01L 23/562
See application file for complete search history.

(56) References Cited

U.S. PATENT DOCUMENTS

| | | | | |
|---|---|---|---|---|
| 5,594,234 | A * | 1/1997 | Carter, Jr. ......... | H01L 23/49503 257/676 |
| 5,656,550 | A * | 8/1997 | Tsuji .................... | H01L 21/565 257/786 |
| 7,064,420 | B2 * | 6/2006 | Han .................. | H01L 23/49503 257/669 |

(Continued)

*Primary Examiner* — Tuan A Hoang
(74) *Attorney, Agent, or Firm* — Seed IP Law Group LLP

(57) ABSTRACT

A leadframe having extensions around an outer edge of a die pad are disclosed. More specifically, leadframes are created with a flange formed at the outer edge of the die pad and extending away from the die pad. The flange is bent, such that it is positioned at an angle with respect to the die pad. Leadframes are also created with anchoring posts formed adjacent the outer edge of the die pad and extending away from the die pad. The anchoring posts have a central thickness that is less than a thickness of first and second portions opposite the central portion. When the leadframe is incorporated into a package, molding compound completely surrounds each flange or anchoring post, which increases the bond strength between the leadframe and the molding compound due to increased contact area. The net result is a reduced possibility of delamination at edges of the die pad.

18 Claims, 9 Drawing Sheets

(56) References Cited

U.S. PATENT DOCUMENTS

| | | | |
|---|---|---|---|
| 7,176,582 B2* | 2/2007 | Kloen | H01L 21/4828 257/781 |
| 2009/0072367 A1* | 3/2009 | Poddar | H01L 24/83 257/676 |
| 2009/0152683 A1* | 6/2009 | Nguyen | H01L 29/0657 257/620 |
| 2010/0259908 A1* | 10/2010 | Sutardja | H01L 23/49503 361/760 |
| 2015/0228611 A1* | 8/2015 | Ng | H01L 21/4842 257/99 |

* cited by examiner

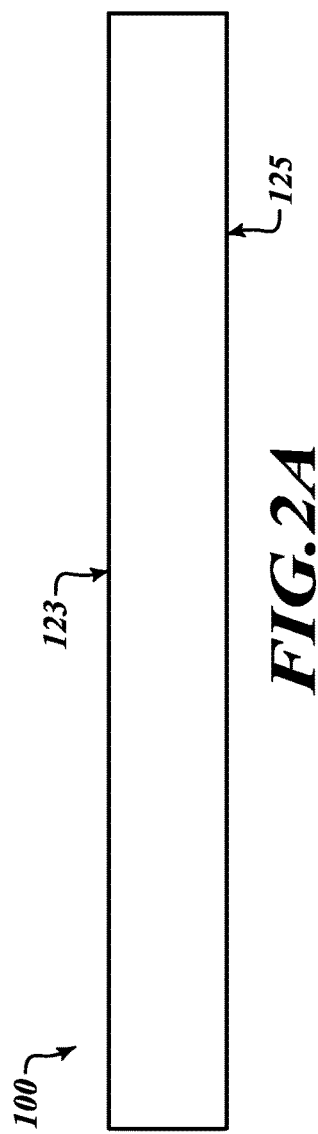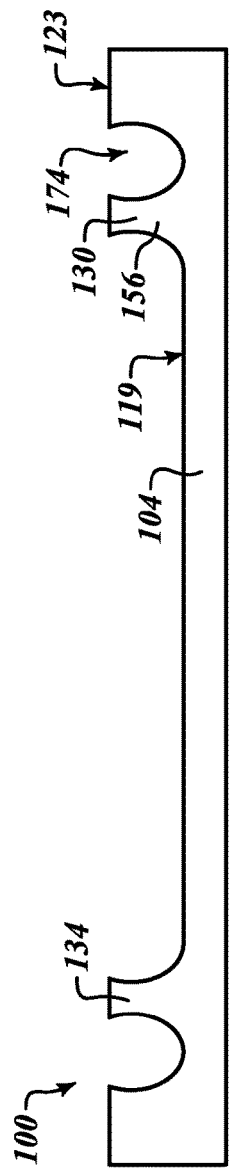

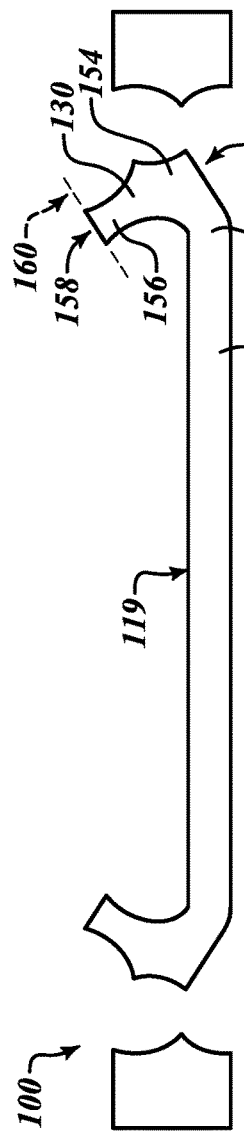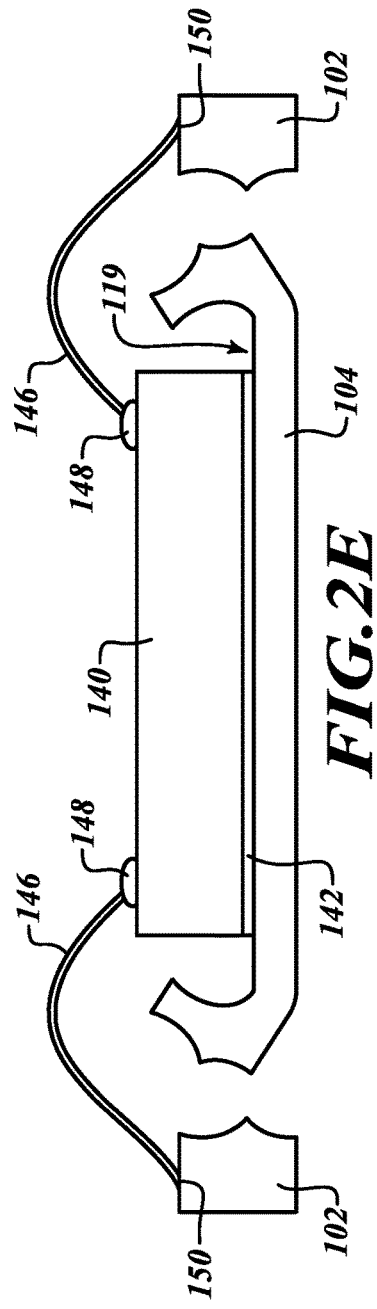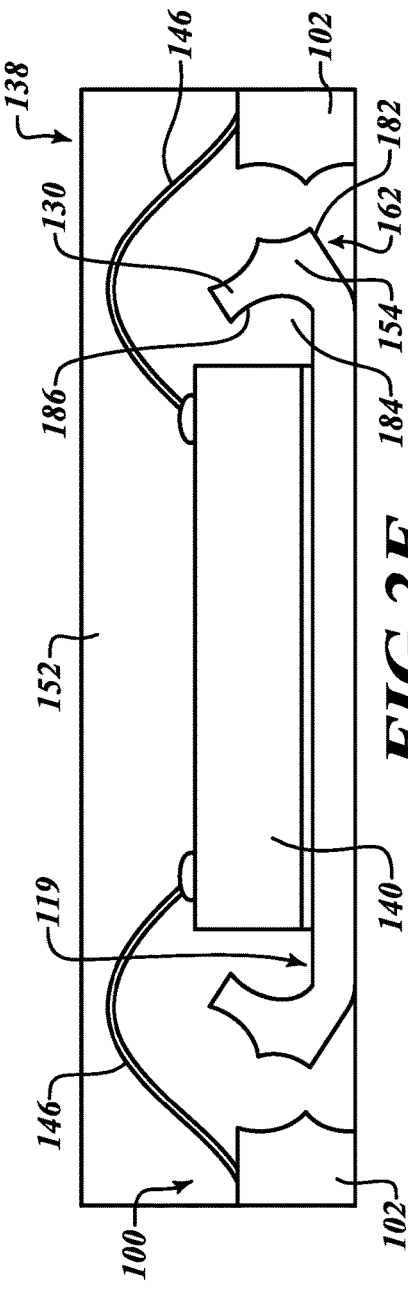

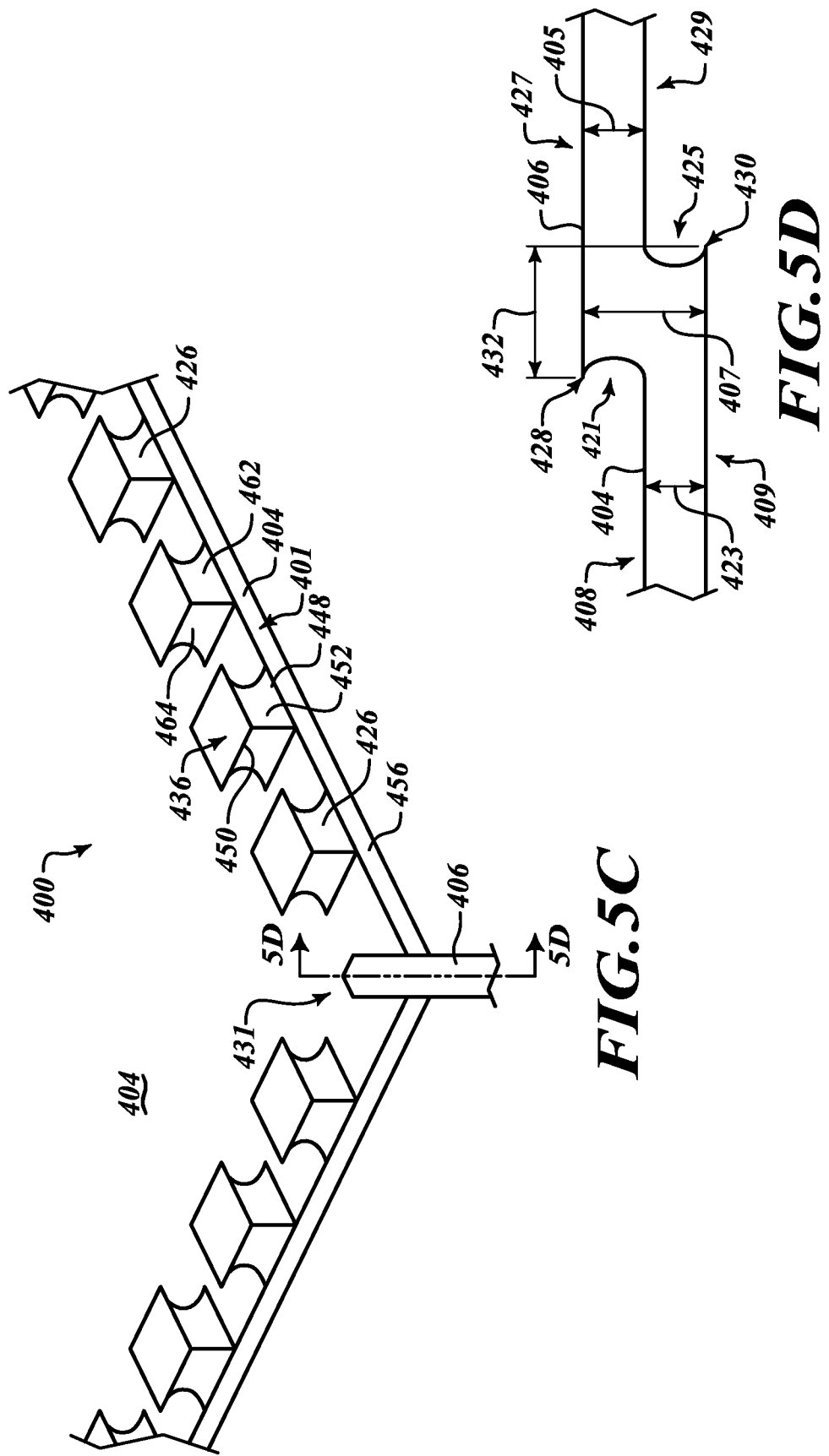

US 11,031,350 B2

LEADFRAME WITH PAD ANCHORING MEMBERS AND METHOD OF FORMING THE SAME

BACKGROUND

Technical Field

The present disclosure is directed to a leadframe having extensions around a die pad that are at an angle with respect to a surface of the die pad.

Description of the Related Art

Quad flat no-lead ("QFN") packages are common in the packaging space because of their small size and excellent performance for many applications. These packages include leadframes where a back surface of a die pad is exposed on a back of the package. Leads are also exposed on the back of the package and are spaced from, and surround the die pad. Within the package, the leadframes support a die in a central position and often include wire bonds from the die to the leads. During package manufacturing, molding compound, or sealant, is formed over the die, the wires, and the leadframe to complete the package. The primary purpose of the molding compound is to protect the electrically active components contained within the package.

However, such packages are often susceptible to cracking, which leads to package failure when water or other contaminants are allowed to enter the package through the crack. In particular, cracks are most likely to form at edges of the die pad because those areas experience the highest amount of stress due to expansion and contraction of the leadframe during use, as described below.

In an attempt to remedy this undesirable outcome, some packages include a die pad with an outer edge, wherein a recess is etched or otherwise formed under one or more edges. In such packages, a plane defined by the front surface of the die pad is coplanar with a plane defined by a top surface of the leads. When the molding compound is formed, the molding compound occupies the recess so as to form a seal between the molding compound and the leadframe.

But, this solution overlooks the fact that the coefficients of thermal expansion, or the rate at which a size of an object changes in relationship to temperature, are different for the metal of the leadframe and the molding compound. As such, when the package endures repeated heating and cooling cycles during use, the metal that comprises the leadframe will expand and contract much more quickly than the surrounding molding compound. This cycle will eventually cause the leadframe to delaminate, or separate, from the molding compound, which forms a crack. These cracks are much more common at the outer edges of the die pad, as these areas of the die pad are in direct contact with the molding compound and experience the largest amount of stress and movement due to the expansion and contraction of the die pad. As described above, cracking of this nature is a common source of package failure. Therefore, there remains a need for a leadframe with pad anchoring members that more effectively seal the package, thus further preventing the possibility of package delamination or cracking.

In addition, in the packaging space, there is an ever-present need for producing smaller packages, as attempts continue to be made to produce smaller and sleeker user devices incorporating the packages. As such, there is a particular need for smaller or thinner packages with increased performance and a reduced possibility of package delamination.

BRIEF SUMMARY

The exemplary embodiments in the present disclosure are directed to improving reliability of integrated circuit packages by reducing the possibility of cracks forming between an edge of a leadframe and a molding compound surrounding the leadframe in the package.

In one exemplary embodiment, a leadframe is formed with a centrally located die pad. The die pad has a first, or front, surface and an outer edge bounding the first surface. A flange is formed next to the outer edge of the die pad and extends away from the outer edge. In other words, the flange has a height that is greater than a thickness of the die pad. The flange is also bent towards a center of the die pad, such that a plane defined by a second, or top, surface of the flange is positioned at an angle with respect to the first surface of the die pad. In some embodiments, this angle is any angle that is not parallel to the first surface of the die pad. In other embodiments, this angle is at a substantially perpendicular angle. The leadframe can further be incorporated into a package by coupling a die to the die pad, and bonding one or more wires between the die and leads of the leadframe. Then, a molding compound is formed over the die, the wires, and the leadframe to create the package. The molding compound completely surrounds the flange, thus providing a strong bond between the molding compound and the leadframe, which reduces the possibility of a crack at the outer edge of the die pad.

In a second exemplary embodiment, a method of forming such a leadframe is described. The method begins with a flat sheet of material. A first recess and a die pad are formed in a first surface of the sheet. This forming process includes defining the flange between the first recess and the die pad. Then, the die pad and the flange are separated from leads by forming a second recess in a second surface of the sheet. The second recess is aligned with the first recess and cooperates with the first recess to define a space, or gap, between the flange and each lead. Then, the flange is bent towards the center of the die pad, which positions a first surface of the flange at an angle with respect to the first surface of the die pad, as described above. A package is formed by following the above steps, including coupling a die to the die pad, bonding wires between the die and the leads, and forming a molding compound over the die, the wires, and the leadframe. Forming the molding compound includes completely surrounding each of the flanges, which prevents the leadframe from separating from the molding compound.

In a third exemplary embodiment, a leadframe includes a die pad with an outer edge having multiple flanges. Each flange is separated by a recess formed in the outer edge, such that the outer edge of the die pad has a serrated shape or configuration. This leadframe can be combined into a package as described above, with molding compound surrounding each of the flanges.

In a fourth exemplary embodiment, a leadframe is formed with a central die pad spaced from multiple leads. Further, multiple anchoring posts are formed on, and extend from, an outer edge of the die pad. Each anchoring post includes a first portion and a second portion with a central portion between the first and second portions. Sidewalls of the anchoring posts have a concave or convex shape, such that a thickness of the first and second portions may be greater than, or less than, a thickness of the central portion. When the leadframe is incorporated into a package, molding compound surrounds each of the anchoring posts. The anchoring posts provide for increased contact surface between the molding compound and the leadframe, thus forming a stronger bond and reducing the possibility of package failure.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. The sizes and relative positions of elements in the drawings are not necessarily drawn to scale. For example, the shapes of various elements and angles are not necessarily drawn to scale, and some of these elements may be enlarged and positioned to improve drawing legibility. Further, the particular shapes of the elements as drawn, are not necessarily intended to convey any information regarding the actual shape of the particular elements, and may have been solely selected for ease of recognition in the drawings.

FIGS. 2A-2F are cross-sectional views of an exemplary method of forming the leadframe of FIG. 1A;

FIG. 5C is a partial perspective view of a portion of the leadframe of FIG. 5A showing the plurality of anchoring posts in more detail; and FIG. 5D is a partial cross-sectional view of a tie bar of the leadframe of FIG. 5A showing the connection to the die pad in more detail.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with leadframes and chip packaging have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The present disclosure is directed to improving reliability of packages containing leadframes by providing a leadframe with a die pad having one or more pad anchoring members to improve the bond between the leadframe and a molding compound formed over the leadframe, thus reducing the possibility of a package crack.

Figure 1A:
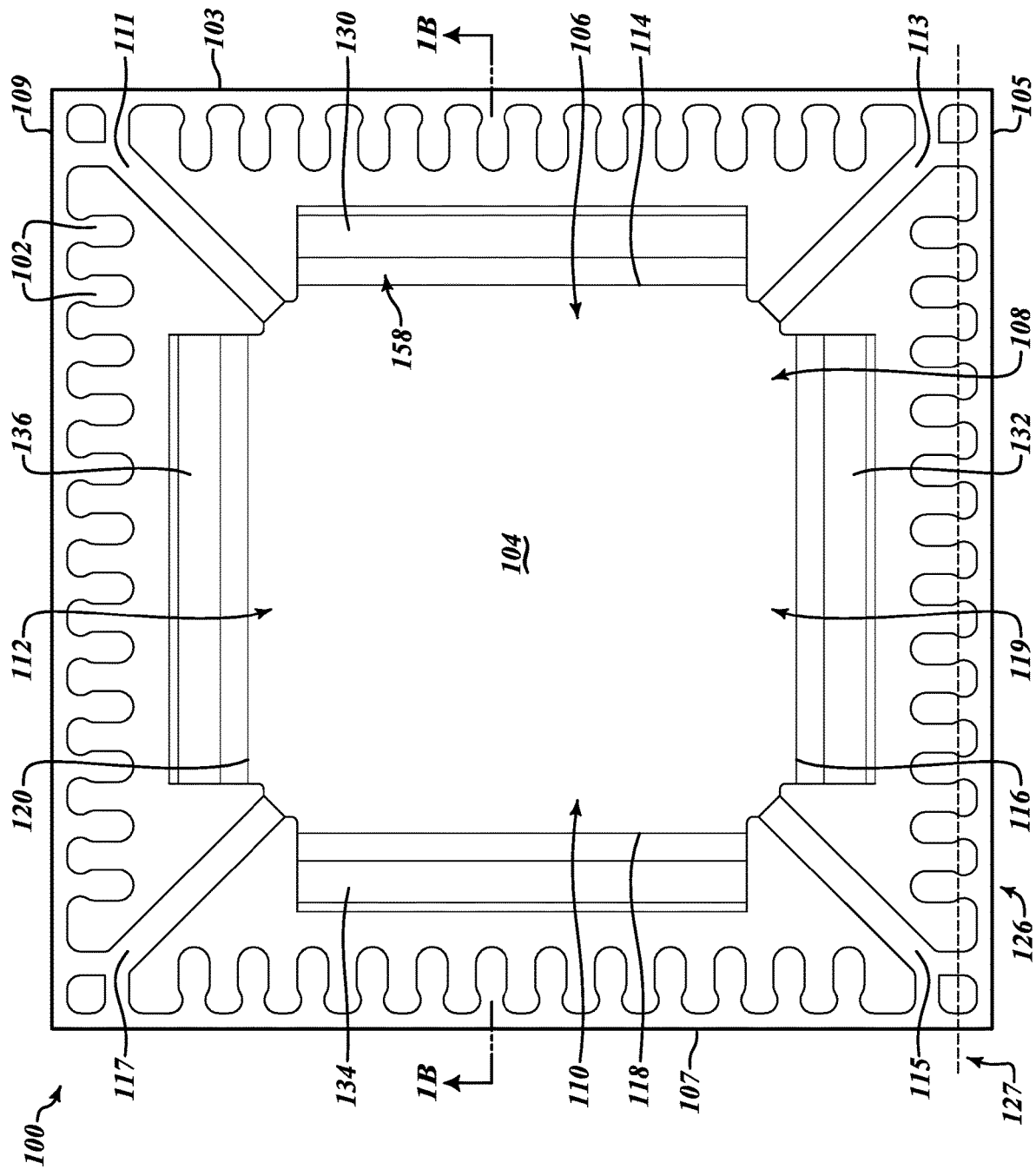
FIG. 1A is a top down view of an exemplary embodiment of a leadframe according to the present disclosure having a first flange extending from a first outermost edge of a die pad.
Figure 1B:
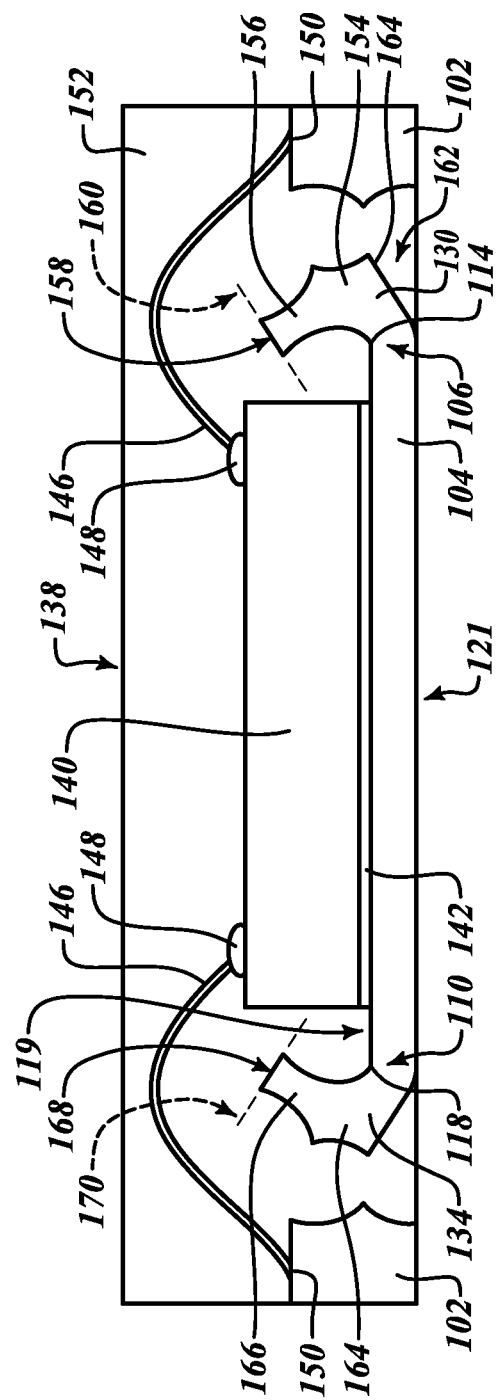
FIG. 1B is a cross-sectional view of the leadframe of FIG. 1A showing the leadframe incorporated into a package and the first flange in more detail.

FIGS. 1A-B are an exemplary embodiment of the present disclosure showing a top-down view, and a cross-sectional view, respectively, of a leadframe 100 in various stages of manufacturing. In this embodiment, the leadframe 100 includes a plurality of leads 102 spaced from a die pad 104 having a first surface 119 opposite a second surface 121. The second surface 121 is shown in more detail with reference with to FIG. 1B. The leadframe 100 has a rectangular shape with a first edge 103, a second edge 105, a third edge 107, and a fourth edge 109. The plurality of leads 102 are spaced around the first, second, third and fourth edges 103, 105, 107, 109 of the leadframe 100. In some embodiments the plurality of leads 102 includes twelve leads 102 spaced equidistant from each other, with an identical number of leads 102 on each edge 103, 105, 107, 109 of the leadframe 100. However, other embodiments may include fewer, or more leads 102 with different spacing and arrangement in order to suit particular package requirements.

The die pad 104 similarly has a rectangular shape with a first side 106, a second side 108, a third side 110, and a fourth side 112. Each of the first side 106, the second side 108, the third side 110, and the fourth 112 include an outermost edge of the die pad 104. For example, the first side 106 includes first outermost edge 114, the second side 108 includes second outermost edge 116, the third side 110 includes third outermost edge 118, and the fourth side includes fourth outermost edge 120. However, one of skill in the art will appreciate that the die pad 104 and the leadframe 100 can be formed to have alternate shapes, for example a circle, in which case the die pad 104 would have a singular outermost edge.

The die pad 104 is coupled to the edges 103, 105, 107, and 109 of the leadframe 100 by a first bar 111, a second bar 113, a third bar 115, and a fourth bar 117. In this embodiment, the bars 111, 113, 115, and 117 are tie bars. The bars 111, 113, 115, and 117 provide support to the die pad 104 while the leadframe 100 undergoes further processing, such as coupling a die to the die pad 104 or bonding wires between the die and the leads 102. Such processes are described in more detail below.

When the leadframe 100 is incorporated into a package, as described herein, the die pad 104 is electrically isolated from the plurality of leads 102 by removing an outermost portion 126 of the leadframe 100 along line 127. The outermost portion 126 may be removed by any number of conventional processes, such as wet or dry etching, sawing with a mechanical blade, stamping, or laser processing, for example. Further, although FIG. 1A illustrates only one such outermost portion 126 being removed, one of skill in the art will appreciate that an outermost portion can be removed from each edge 103, 105, 107, 109 of the leadframe 100 in a similar manner to electrically isolate the die pad 104 from the plurality of leads 102.

In addition, the size of the outermost portion 126 to be removed from the leadframe 100 for electric isolation may vary to suit the package requirements. In other words, the line 127 may be moved closer to the edge 105, or closer to the die pad 104, such that varying portions 126 are removed when incorporating the leadframe 100 into a package. In an embodiment, the portions to be removed along each edge 103, 105, 107, 109 are the same, while in other embodiments, the portions are different. In yet a further embodiment, the portions to be removed include removing a portion of each tie bar 111, 113, 115, 117.

The leadframe 100 further includes a first flange 130 extending from the first outermost edge 114 of the first side 106 of the die pad 104. Similarly, the leadframe 100 includes a second flange 132 extending from the second outermost edge 116 of the second side 108 of the die pad 104, a third flange 134 extending from the third outermost edge 118 of the third side 110 of the die pad 104, and fourth flange 136 extending from the fourth outermost edge 120 of the fourth side 112 of the die pad. The first flange 130 is shown in more detail in the cross-sectional view of FIG. 1B.

FIG. 1B shows a cross-sectional view of the die pad 104 and the leads 102 along the line 1B in FIG. 1A, wherein the die pad 104 and the leads 102 are incorporated into a package 138. In some instances, the package 138 is a QFN package. The package 138 further includes a die 140 coupled to the first surface 119 of the die pad 104 by a tape or glue 142. The package 138 also includes a plurality of wires 146 coupled between the die 140 and the leads 102. The coupling between the wires 146 and the die 140 may be accomplished via one or more electrical contacts 148, which may be pillars or solder bumps extending from the die 140 and one or more contact pads or lands 150 on the leads 102. A molding compound 152 is then formed over the leadframe 100, the die pad 104, the leads 102, the die 140, and the plurality of wires 146 to form the package 138.

FIG. 1B also shows the first flange 130 and the third flange 134 in more detail. The first flange 130 includes a first portion 154 coupled to the first side 106 of the die pad 104. In this embodiment, the first portion 154 of the first flange 130 is coupled to the first side 106 at the first outermost edge 114 of the die pad 104. The first flange 130 extends from the first outermost edge 114 and away from the first surface 119 of the die pad 104. The first flange 130 further includes a second portion 156 coupled to, and extending from, the first portion 154. The first and second portions 154, 156 may be a single unitary material that is contiguous with the die pad.

The second portion 156 includes a third surface 158. A plane 160 of the third surface 158, or defined by the third surface 158, is positioned at an angle with respect to the first surface 119 of the die pad 104. In other words, the first flange 130 is bent after forming, which not only positions the plane 160 of the third surface 158 at an angle with respect to the first surface 119 of the die pad 104, but it is also raises the first flange 130 from the second surface 121, such that a cavity 162 is defined or formed between an edge 164 of the first portion 154 of the first flange 130 and a plane of the second surface 121 of the die pad 104. When the leadframe 100 is incorporated into a package with molding compound as described below, the molding compound 152 is in the cavity 162.

In some embodiments, the angle of the plane 160 of the third surface 158 with respect to the first surface 119 of the die pad 104 is a transverse angle, which is any angle that is not parallel to the first surface 119. In other embodiments, the angle of the plane 160 of the third surface 158 with respect to the first surface 119 of the die pad 104 is a substantially perpendicular angle. This latter arrangement is described in more detail below with reference to FIG. 3. Although only the features of the first flange 130 are described in detail herein, it is to be understood that each of the second, third, and fourth flanges 132, 134, and 136 can be formed to have similar or different characteristics in comparison for the first flange 130.

For example, in this embodiment, the third flange 134 extends from the third side 110 of the die pad 104, and in particular, from the third outermost edge 118 of the third side 110 of the die pad 104. The third flange 134 also extends away from the first surface 119 of the die pad 104. The third flange 134 further includes a third portion 164 coupled to the third side 110 of the die pad 104 and fourth portion 166 coupled to, and extending from the third portion 164. The third and fourth portions 164, 166 may be a single unitary material that is contiguous with the die pad 104. The fourth portion 166 includes a fourth surface 168 with a plane 170 of the fourth surface 168 being at an angle with respect to the first surface 119.

In some embodiments, the angle of the plane 170 of the fourth surface 168 with respect to the first surface 119 is a transverse angle, while in other embodiments, it is a perpendicular angle. In yet other embodiments, the angle of the plane 170 of the fourth surface 168 with respect to the first surface is substantially equivalent to the angle of the plane 160 of the third surface 158 with respect to the first surface 119. In still further embodiments, the angle of the plane 170 of the fourth surface 168 with respect to the first surface is different from the angle of the plane 160 of the third surface 158 with respect to the first surface 119. In addition, some embodiments include the die pad 104 having only a first flange 130, while other embodiments include the die pad 104 having any combination, including all, of the first, second, third and fourth flanges 130, 132, 134, 136.

FIGS. 2A-F are cross-sectional views of an exemplary method of forming the leadframe 100. In this embodiment, the method begins in FIG. 2A with the leadframe 100 comprising a sheet of metal, preferably of copper or a copper alloy, although other known metals, semiconductors, and nonconductive materials may be used. The leadframe 100 has a first surface 123 opposite a second surface 125. Then, in FIG. 2B, a first recess, trench, or opening 174 and the die pad 104 are formed in the first surface 123 of the leadframe 100. The die pad and the first recess can be formed in a same etching step that removes portions of the leadframe. This forming process forms the second portion 156 of the first flange 130, which includes the second portion 156 of the first flange 130 positioned between the first recess 174 and the die pad 104 and extending away from the first surface 119 of the die pad 104.

In FIG. 2C, the die pad 104 and the first flange 130 are separated from the plurality of leads 102. The separating process includes forming a second recess 176 in the second surface 125 of the leadframe 100. The second recess 176 is aligned with the first recess 174 and cooperates with the first recess 174 to separate the first flange 130 from the plurality of leads 102. In other words, the second recess 176 is aligned with the first recess 174 and is formed to a depth that removes a remaining portion of the leadframe between the recesses 174, 176, such that the first and second recesses 174, 176 define a gap or space 178 between the first flange 130 and the plurality of leads 102. A depth of each recess 174, 176 may vary, such that a depth of the first recess 174 may be greater than a depth of the second recess 176 and vice versa. The depths of each recess 174, 176 may also be substantially equivalent. Further, it is to be understood that the forming and separating are accomplished by any number of available methods, including by a wet chemical etch, a dry etch, laser processing, stamping, or by mechanical blade, among others.

The forming and separating process described above results in the first flange 130 having a first portion 154 coupled to the die pad 104. As noted above, the first portion 154 is coupled to the die pad 104 at the first outermost edge 114 of the first side 106 of the die pad 104. The first flange 130 further includes the second portion 156 having the third surface 158. After forming the first and second surfaces 123, 125 and separating the die pad 104 and the flange 130 from the leads 102, the first flange 130 is bent towards a center of the die pad 104, as in FIG. 2D.

The bending includes forming the cavity or space 162 adjacent the first portion 154 of the first flange 130. The bending also includes a portion 180 connecting the die pad 104 to the first flange 130 having a curved shape. In an embodiment, the bending is accomplished by a stamping machine, although other methods of bending are possible. The bending further includes positioning the plane 160 of the third surface 158 of the second portion 156 of the first flange 130 at an angle with respect to the first surface 119 of the die pad. In an embodiment, the angle between the plane 160 of the third surface 158 with respect to the first surface 119 of the die pad 104 is a transverse angle, while in yet other embodiments, the angle is between an 85 and 90 degree angle.

FIG. 2E shows a further step in the method where the die 140 is coupled to the first surface 119 of the die pad 104 with the glue or tape 142. However, it is to be understood that in other embodiments, the die 140 is coupled to the die pad 104 at earlier stages in the method described herein. For example, in separate embodiments, the die 140 is coupled to the die pad 104 in FIG. 2B, in FIG. 2C, or in FIG. 2D. Further, in an embodiment, the method ends after FIG. 2D without the die 140 attached. In other words, it is possible to manufacture the leadframe 100 having the first flange 130 as in FIG. 2D as a separate unit that is later combined with the below elements to form the package 138.

As shown in FIG. 2E, once the die 140 is attached to the first surface 119 of the die pad 104, the plurality of wires 146 are bonded between the pillars or bumps 148 on the die 140 and the contact pads or lands 150 on the plurality of leads 102. Once the wires 146 and the die 140 are in place, the molding compound 152 is formed on the die 140, the wires 146, the plurality of leads 102, the first flange 130 and the leadframe 100 to form the package 138 as in FIG. 2F. For clarity, the leadframe 100 includes the plurality of leads 102, the die pad 104 and the first flange 130. The molding compound 152 is also in the cavity 162 adjacent the first portion 154 of the first flange 130. As such, the molding compound 152 completely surrounds the first flange 130, including being under a base 182 of the first flange 130 as well as in a space 184 bounded by a curved sidewall 186 of the first flange 130 and the first surface 119 of the die pad 104.

Although the method described in the embodiment above only describes forming the first flange 130 in detail, one of skill in the art will appreciate that the same method can be utilized to form the second, third, and fourth flanges 132, 134, and 136 on the second, third, and fourth edges 108, 110, 112, respectively, of the die pad 104.

Figure 3:
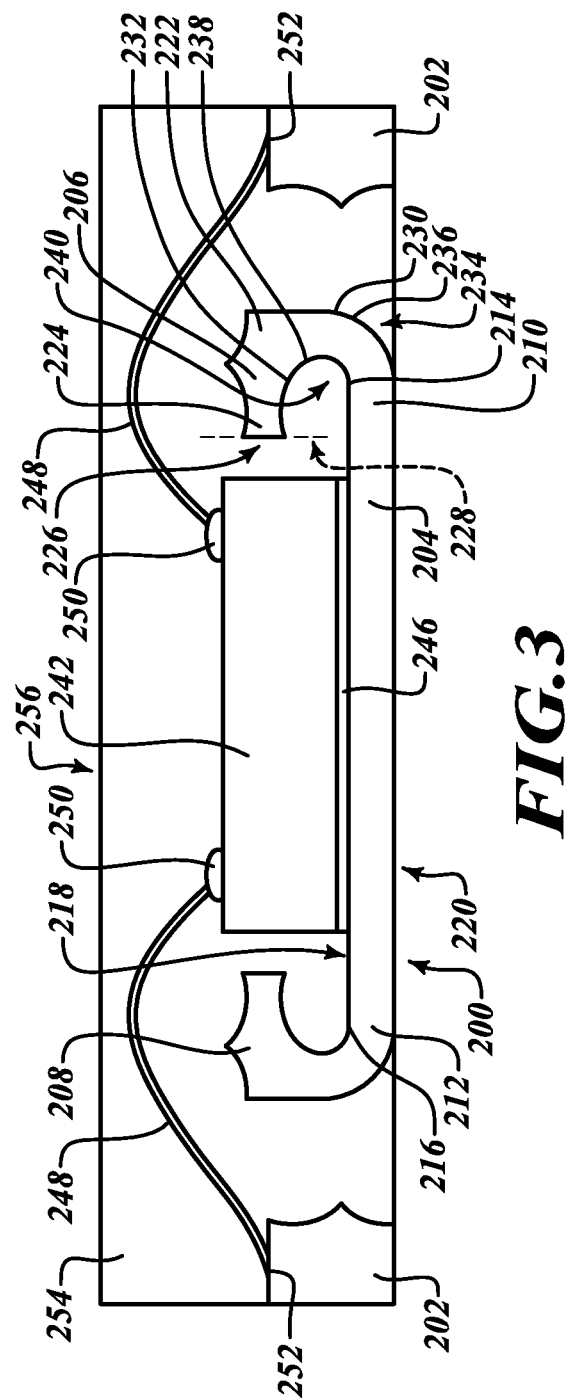
FIG. 3 is a cross-sectional view of an alternative exemplary embodiment according to the present disclosure showing the first flange in an alternative configuration.

FIG. 3 shows a cross-sectional view of an alternative exemplary embodiment of the present disclosure including a leadframe 200 having a die pad 204 spaced from a plurality of leads 202. The die pad 204 includes a first side 210 having a first outermost edge 214 and a second side 212 having a second outermost edge 216. The die pad further includes a first surface 218 opposite a second surface 220. A first flange 206 is coupled to the die pad 204 and extends from the first side 210 of the die pad 204 and away from the first surface 218 of the die pad 204. The first flange 206 includes a first portion 222 and a second portion 224 extending from the first portion 222. The first portion 222 of the first flange 206 is coupled to the die pad 204 adjacent the first side 210, and in an embodiment, at the first outermost edge 214 of the first side 210 of the die pad 204. The second portion includes a third surface 226. In this embodiment, a plane 228 of the third surface 226 is substantially perpendicular to the first surface 218 of the die pad 204, such as at an angle with respect to the first surface 218 of the die pad between 85 and 95 degrees.

As such, the first flange 206 includes a first sidewall 230 having a third portion 236 with a first curved shape and a second sidewall 232 having a fourth portion 238 having a second curved shape. The first curved shape defines a first cavity 234 adjacent the first portion 222 of the first flange 206 and the second curved shape defines a second cavity 240 bounded by the second sidewall 232 and the first surface 218 of the die pad 204.

After the leadframe 200 is formed, a die 242 is coupled to the first surface 218 of the die pad 204 by a tape or glue 246. Then, a plurality of wires 248 are bonded between pillars or bumps 250 on the die 242 and contact pads 252 on the plurality of leads 202. Finally, a molding compound 254 is formed over the plurality of wires 248, the leadframe 200, the leads 202, the die pad 204, the first flange 206, the second flange 208, and the die 242 to form a package 256. In the package 256, the molding compound 254 occupies the first cavity 234 and the second cavity 240. Further, the molding compound 254 completely surrounds the first flange 206 and the second flange 208, including the first and second sidewalls 230, 232 of the first flange 206. Although the details of the second flange 208 are not explained in detail herein, it is to be appreciated that the second flange 208 can include identical features to that of the first flange 206. Further, a third and fourth flange may be formed as described in earlier embodiments, each having similar features as the first and second flanges 206, 208.

Figure 4:
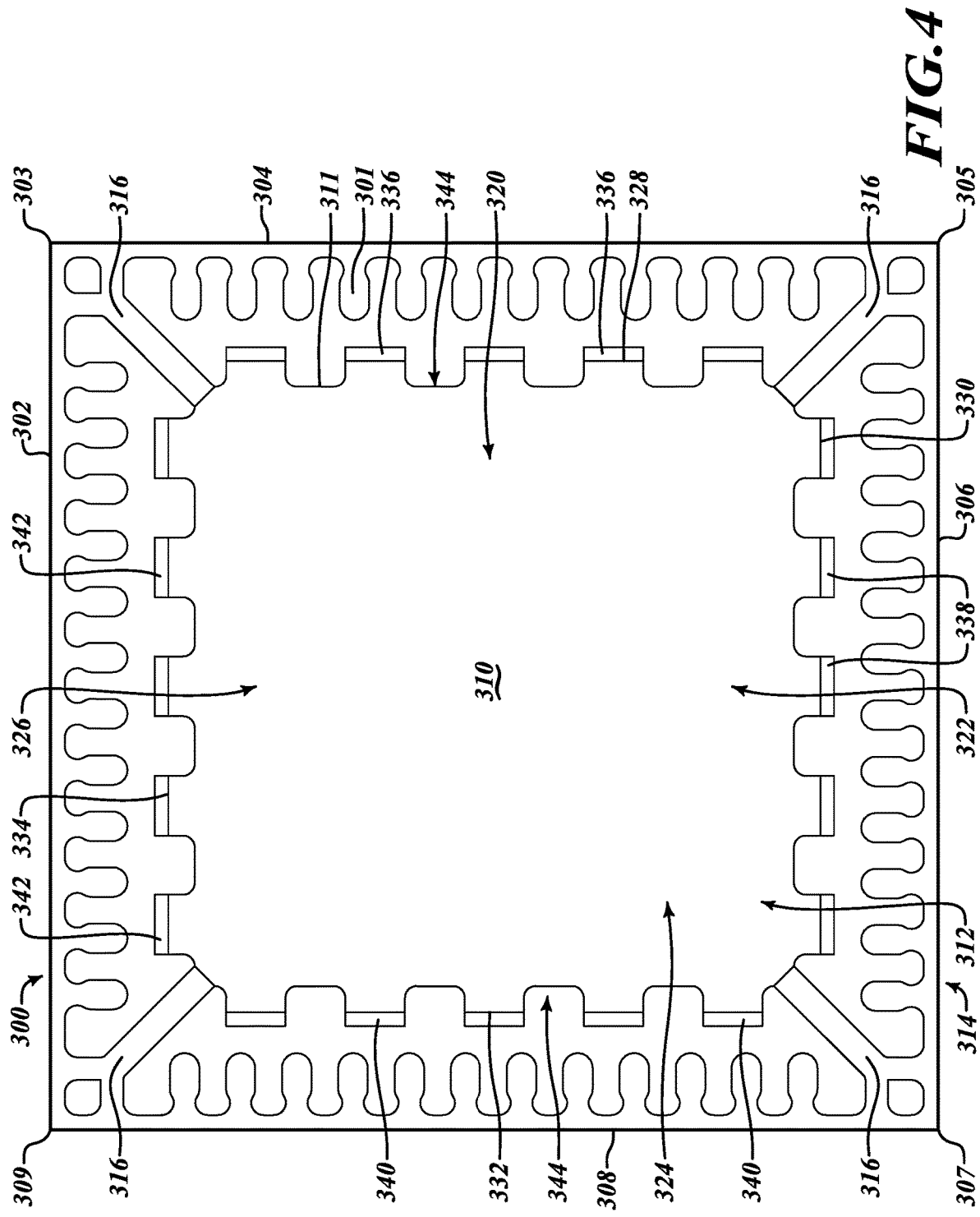
FIG. 4 is a top-down view of an alternative exemplary embodiment of a leadframe according to the present disclosure having a die pad with an serrated outermost edge and a plurality of flanges formed adjacent to the outermost edge.

FIG. 4 illustrates a top-down view of an alternative exemplary embodiment of a leadframe 300 according to the present disclosure having a first edge 302, a second edge 304, a third edge 306 and a fourth edge 308. The leadframe 300 further includes a die pad 310 having a first surface 312 opposite a second surface 314 and spaced from a plurality of leads 301. The plurality of leads 301 are spaced around each edge 302, 304, 306, 308 of the leadframe 300, and in some embodiments, spaced equidistant from each other. The die pad 310 is coupled to the edges 302, 304, 306, 308 of the leadframe 300 by a plurality of tie bars 316 that extend from the die pad 310 to corners 303, 305, 307, 309 of the leadframe 300. The die pad 310 may be electrically isolated from the plurality of leads 301 when the leadframe 300 is incorporated into a package by removing a portion of the leadframe 300 along each edge 302, 304, 306, 308, as described above with reference to FIG. 1A.

The die pad 310 further includes a first side 320, a second side 322, a third side 324, and a fourth side 326. The first side 320 includes a first peripheral edge 328, the second side 322 includes a second peripheral edge 330, the third side 324 includes a third peripheral edge 332, and the fourth side 326 includes a fourth peripheral edge 334 of the die pad 310. A first plurality of flanges 336 are formed along the first peripheral edge 328, a second plurality of flanges 338 are formed along the second peripheral edge 330, a third plurality of flanges 340 are formed along the third peripheral edge 332, and a fourth plurality of flanges 342 are formed along the fourth peripheral edge 334. Each of the plurality of flanges 336, 338, 340, 342 are separated from each other by a recess, grooves, or indentations 344, such that the sides 320, 322, 324 and 326 of the die pad 310 have a generally serrated configuration or arrangement. The flanges 336, 338, 340, 342 are extensions from the die pad 310 from an innermost edge 311 of the recesses 344. The recesses 344 have generally curved shapes based on formation by etching.

Further, the forming of the leadframe 300 can include forming as described above with reference to the other embodiments. As such, although the recesses 344 have a generally rounded "U" shape, it is possible to produce other shapes using such processes, such as a rounded trapezoidal shape with angled sidewalls. The plurality of flanges 336, 338, 340, and 342 can also include five flanges per side 320, 322, 324, and 326, or more or less, as needed in for a given application. Finally, each of the flanges 336, 338, 340, and 342 are bent according to the methods described herein, such that when the leadframe 300 is incorporated into a package with molding compound, the molding compound surrounds each of the flanges 336, 338, 340, and 342 to anchor the molding compound to the leadframe 300, thus preventing the possibility of a crack.

FIGS. 5A-D are views of an alternative exemplary embodiment of the present disclosure showing a leadframe 400 in various stages of manufacturing. The leadframe 400 includes a die pad 404 spaced from a plurality of leads 402. The die pad 404 is coupled to an outer edge 403 of the leadframe 400 through a plurality of tie bars 406. The die pad 404 includes a first surface 408 opposite a second surface 409, wherein the first surface 408 is bounded by an outermost edge 401 of the die pad 404. The die pad further includes a first side 410, a second side 412, a third side 414, and a fourth side 416. In this embodiment, the outermost edge 401 includes the first side 410 having first outermost edge 418, the second side 412 having a second outermost edge 420, the third side 414 having a third outermost edge 422, and the fourth side 416 having a fourth outermost edge 424.

A plurality of anchoring posts 426 are formed on the first side 408 of the die pad 404 and spaced along the outermost edge 401 of the die pad 404. In this embodiment, the plurality of anchoring posts 426 includes at least three anchoring posts 426 positioned on each side 410, 412, 414 and 416 of the die pad 404 along the outermost edge 401 of the die pad 404. One of skill in the art will understand that the leadframe 400 of this embodiment may include less than three anchoring posts 426 per side, or more than three anchoring posts per side depending on the intended application of the leadframe 400.

For example, in an embodiment, the leadframe 400 includes no anchoring posts 426 per side, as described in more detail below, while in other embodiments, the leadframe 400 includes one, two, three, four, five, six, seven, eight, nine, ten, or more anchoring posts 426 per side. As such, various illustrations accompanying the present disclosure may include varying numbers of anchoring posts 426, which is intended to show that the present disclosure is not limited by the number of anchoring posts 426 per side. Further, in an embodiment, each of the plurality of anchoring posts 426 are connected together to form a singular, unitary, or integral anchoring ridge along an outer edge of the die pad 404, while in other embodiments, successive ones, or pairs of anchoring posts 426 are connected together to form anchoring posts with a generally rectangular shape.

The anchoring posts 426 may be spaced, as in this embodiment, equidistant from each other along the outermost edge 401. However, in other embodiments, different spacing arrangements may be desirable. In addition, although the anchoring posts 426 of this embodiment are positioned such that a second surface 436 of each anchoring post 426 has an outer edge 438 that aligns with the outermost edge 401, the anchoring posts 426 can be formed with a space between the outer edge 438 of each post 436 and the outermost edge 401 of the die pad. The second surface 436 of each anchoring post 426 in this embodiment preferably has a square shape, although the methods described herein allow for forming other shapes, such as a circle, a triangle, a rectangle, or a trapezoid, for example. Further, the second surface 436 of each anchoring post 426 has a second thickness 413 that will be described in more detail below.

In addition, the die pad 404 may be electrically isolated from the plurality of leads 402 when the leadframe 400 is incorporated into a package by removing a portion of the leadframe 400 along the outer edge 403, as described above with reference to FIG. 1A.

Figure 5A:
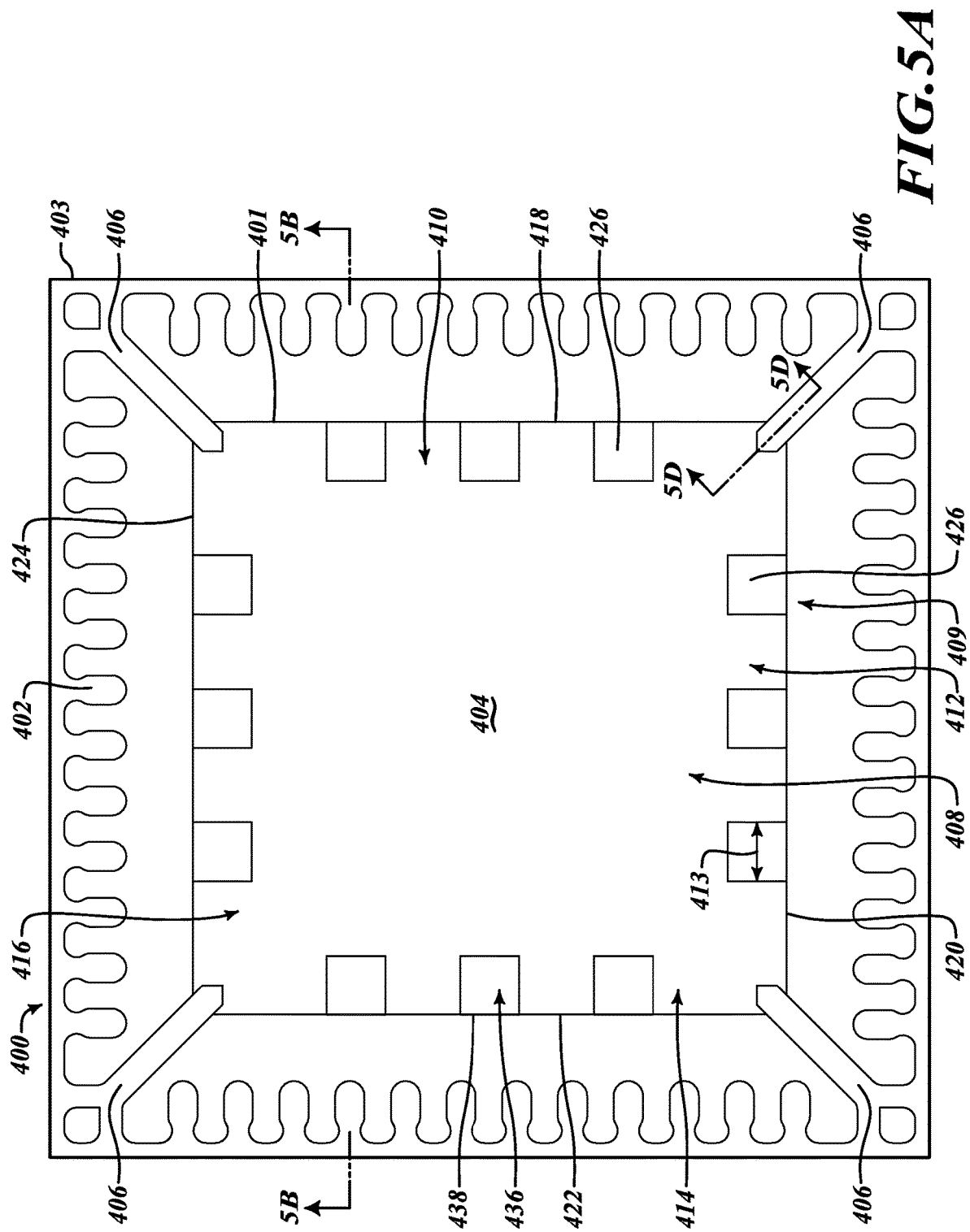
FIG. 5A is top-down view of an alternative exemplary embodiment of a leadframe according to the present disclosure having a plurality of anchoring posts spaced along an outermost edge of a die pad.
Figure 5B:
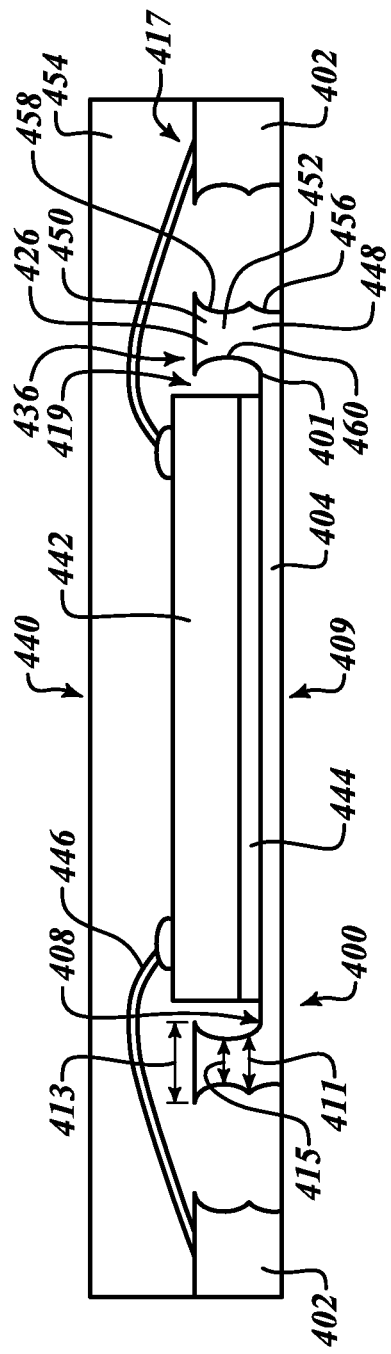
FIG. 5B is a cross-sectional view of the leadframe of FIG. 5A showing the plurality of anchoring posts in more detail.

FIG. 5B is a cross-sectional view of the exemplary embodiment of the leadframe 400 showing the leadframe 400 incorporated into a package 440 and the anchoring posts 426 in more detail. The package 440 includes the plurality of leads 402 spaced from the die pad 404, with the die pad 404 having the first surface 408 opposite the second surface 409. A die 442 is coupled to the first surface 408 of the die pad 404 with a glue or tape 444 and a plurality of wires 446 are bonded between the die 442 and the leads 402, as described herein. Each of the anchoring posts 426 include a first portion 448 and a second portion 450 with a central portion 452 therebetween. The first portion 448 of each anchoring post 426 is coupled to the die pad 404 adjacent the outer edge 401 of the die pad 404. The second portion 450 includes the second surface 436.

In addition, because the anchoring posts 426 are not bent, a space 419 between an edge of the die 442 and a post 426 may be smaller than a similar space between the die and the flange in the above embodiments. As such, the disclosed embodiments that include the posts 426 may include the die 442 having a larger size and shape than the embodiments including flanges. Further, the embodiments disclosed herein do not include a cavity under an outer edge of the die pad, which reduces a length and width of the overall package. In other words, package size is reduced in the disclosed embodiments because outer dimensions of the die pad will be less due to the fact that the die pad does not have to be extended in order to provide material in which to form the cavity or space under the outer edge of the die pad.

Each anchoring post 426 further includes the first portion 448 having a first thickness 411, the second portion 450 having the second thickness 413, and the central portion 452 having a third thickness 415, wherein in this embodiment, the first thickness 411 of the first portion 448 and the second thickness 413 of the second portion 450 are greater than the third thickness 415 of the central portion 452. However, one familiar with the forming processes described herein will appreciate that these thicknesses may vary in other embodiments due to the depth of the etch, or other forming methods. For example, the first thickness 411 may be greater than the second thickness 413 and the central thickness 415, the second thickness 413 may be greater than the first thickness 411 and the central thickness 415, or the central thickness 415 may be greater than the first thickness 411 and the second thickness 413 of the respective portions 448, 450, 452 of each anchoring post 426. Further, the thicknesses 411, 413, 415 may vary between posts 426, depending on the masking and etching process, or other forming process, used to form the posts 426.

FIGS. 5A-B further show that the second surface 436 of each anchoring post 426 is flat and planar. Although not illustrated, it is to be further understood that the forming process can include creating a rounded second surface 436. In addition, in this embodiment, the second surface 436 of each anchoring post 426 is coplanar with a surface 417 of each lead 402. In this embodiment, the surface 417 of each lead 402 is an upper surface, or more specifically, a top, or uppermost surface. To complete the package 440, a molding compound 454 is formed over the die 442, the wires 446, and the leadframe 400, which includes the leads 402, the die pad 404, and the anchoring posts 426. The molding compound 454 completely surrounds each of the anchoring posts 426, such that first, second, and third curved edges 456, 458, 460 of each anchoring post 426 form a tight bond with the molding compound 454 and thus effectively seals the package 440.

FIG. 5C illustrates a partial perspective view of the leadframe 400 showing the plurality of anchoring posts 426 in more detail and a portion of one of the plurality of tie bars 406 extending from the die pad 404. In particular, the second surface 436 of each anchoring post is clearly shown as flat and planar. Further, the leadframe 400 includes the first curved edge 456 and each anchoring post 426 aligned along the outer edge 401, with successive anchoring posts 426 spaced equidistant from each other. One of skill in the art will appreciate that the curved sides 456, 458, 460 of the anchoring posts 426 may be formed by an etching procedure. Further, FIG. 5C illustrates the leadframe 400 and the die pad 404 having at least five anchoring posts 426 per side.

In addition, each anchoring post 426 includes the first and second portions 448, 450 with the first portion 448 being adjacent the outer edge 401 and the second portion 450 being adjacent the second surface 436. The central portion 452 is positioned between the first and second portions 448, 450, wherein the thickness of the first and second portions 448, 450 is greater than the thickness of the central portion. In other words, each anchoring post 426 includes a plurality of concave regions formed along a height of the post 426 between the first and second portions 448, 450. However, because FIG. 5C is a perspective view, only a first concave region 462 and a second concave region 464 are visible. In an embodiment, each side of each anchoring post 426 includes such a concave region, wherein each concave region has similar, or equivalent, curvature formed by etching each side of each post 426 to substantially the same depth. In other embodiments, the concave regions 462, 464 are different because the depth of the etch is different.

FIG. 5D is a partial cross-sectional view of one of the plurality of tie bars 406 showing the connection between the tie bar 406 and the die pad 404 in more detail. The die pad 404 includes a thickness 423 extending between the first and second surfaces 408, 409. Similarly, the tie bar 406 includes a thickness 405 between first and second surfaces 427, 429 of the tie bar 406. As illustrated, the thickness 423 of the die pad 404 is equivalent to the thickness 405 of the tie bar 406, although in other embodiments, the thicknesses 423, 405 are different. For example, in an embodiment, the thickness 423 of the die pad 404 is less than the thickness 405 of the tie bar 406, while in other embodiments, the thickness 423 of the die pad 404 is greater than the thickness 405 of the tie bar 406.

When the first surface of the leadframe 400 is etched or otherwise processed to form the die pad 404 and other features of the present disclosure, as described above with reference to FIGS. 2A-F, a first curved region 421 is formed at the interface between the tie bar 406 and the die pad 404. In other words, the first curved region 421 extends between the first surface 427 of the tie bar 406 and the first surface 408 of the die pad 404. Similarly, when a second surface of the leadframe 400 is etched to form the first curved surface 456 (FIG. 5C) and other features described herein, a second curved region 425 is formed between the second surface 429 of the tie bar 406 and the second surface 409 of the die pad 404 where the tie bar 406 is coupled to the die pad 404.

Further, it is to be understood that although the cross-sectional view of the tie bar 406 described herein illustrates only the first curved region 421 adjacent the die pad 404, a similar curved region may be formed opposite the first curved region 421, such that a portion 431 (FIG. 5C) of the tie bar 406 adjacent the die pad 404 ends in a point, or edge, with curved regions 421 on either side of the point of edge.

When the leadframe 400 is incorporated into a package, the first and second curved regions 421, 425 function similarly to the anchoring posts 426 described herein to form a tight bond between molding compound that will surround each curved region 421, 425 in the package. In an embodiment, each of the plurality of tie bars 406 includes similar curved regions 421, 425. In other embodiments, the leadframe 400 does not include any anchoring posts 426, but rather, the seal between the molding compound and the leadframe 400 when the leadframe 400 is incorporated into a package is accomplished solely with the curved regions 421, 425 of each tie bar 406.

It is to be further appreciated that in an embodiment, an anchoring post 426 is formed in close proximity to, or adjacent, each tie bar 406. This arrangement may be particularly useful in applications where high stresses occur at the corners of a package, as both the anchoring post 426 and the tie bar 406 at each corner will assist in forming a tight bond or seal between molding compound that surrounds each post 462 and tie bar 406 when the leadframe 400 is incorporated in a package, as described above. In other embodiments, the portion 431 of the tie bar 406 adjacent the die pad 404 may have dimensions similar to each of the anchoring posts 426, such that an anchoring post 426 is formed at each corner of the die pad 404, and each such corner anchoring post 426 is connected to the tie bar 406, either through a tapered, or a rectilinear transition. One of skill in the art will appreciate that such arrangements, shapes, and orientations of the tie bar 406 are possible through the etching processes referenced herein.

The first curved region 421 is further defined by a first outermost edge 428 and the second curved region 425 is defined by a second outermost edge 430. The first and second outermost edges 428, 430 are spaced from each other by a first distance 432. The first surface 427 of the tie bar 406 and the second surface 409 of the die pad 404 are spaced from each other by a second distance 407. In an embodiment, the first distance 432 and the second distance 407 are equivalent such that the interface between the tie bar 406 and the die pad 404 has a substantially square cross-section. In other embodiments, the first distance 432 is greater than, or less than, the second distance 407. One of skill in the art will also understand that while not specifically illustrated in the interest of brevity, the tie bars describe herein with reference to other embodiments, for example in FIGS. 1A and 4, include similar features, such that tie bars of the present disclosure further aid in forming a tight seal between molding compound and the leadframes disclosed herein when the leadframes are incorporated into packages.

As will be readily appreciated from the foregoing, the present disclosure achieves a leadframe that reduces the possibility of a package crack by providing anchoring flanges or posts along an edge of the leadframe. Each of the disclosed embodiments provides a solution to the above described issues with packages by increasing the leadframe surface area in contact with the molding compound in a package, thereby increasing bond strength between the molding compound and the leadframe. In particular, each of the flanges and anchoring posts described herein are completely surrounded by the molding compound when incorporated into a package, which prevents the leadframe from unilaterally expanding and contracting. Instead, the molding compound being on all sides of the flanges and anchoring posts freezes such members in place, thereby limiting motion due to expansion and contraction during use and reducing the possibility of delamination at edges of the die pad.

Further, even if a crack were to form in the embodiments of the present disclosure, the raised flanges or anchoring posts act as a wall or barrier inside the package that force the contaminants to overcome gravitational or other forces and to travel a longer path in order to come into contact with sensitive components, thereby preventing package failure even in the event that delamination occurs.

Although not bent, the anchoring posts achieve a similar solution, whereby anchoring posts, or tie bars with similar features as anchoring posts, can be formed in high stress areas of the leadframe, such as at the corners of the die pad, in order to provide additional leadframe material for the molding compound to bond with and thus, form a stronger bond that is more capable of resisting the stronger forces present in those areas to reduce the possibility of delamination.

In addition, the disclosed embodiments benefit from deeper forming processes in order to form larger flanges or anchoring posts and also do not require a cavity formed under an outer edge of the die pad, thus allowing for thinner die pads to be created, which reduces overall package size. In other words, because the disclosed embodiments do not include a cavity under an outer edge of the die pad, a length and width of the die pad along the outer edge can be reduced because the extra die pad material to support the formation of the cavity is no longer necessary, thus resulting in smaller overall packages.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
  a leadframe including:
    a plurality of leads;
    a die pad having a first surface opposite a second surface, the second surface having a first portion substantially parallel with the first surface and a second portion, the second portion being at a first angle to the first portion;
    a first flange extending from a first outermost edge of the die pad and away from the first surface of the die pad, the first flange having a first portion coupled to the first outermost edge of the die pad and a second portion having a third surface, a plane of the third surface being at a first angle with respect to the first surface, the third surface being substantially parallel to the second portion of the second surface; and
    a cavity between an edge of the first portion of the first flange and a plane of the second surface of the die pad.

2. The device of claim 1 wherein the first angle of the plane of the third surface with respect to the first surface is a perpendicular angle.

3. The device of claim 1 further comprising:
  a die coupled to the die pad;
  a plurality of wires coupled between the die and the plurality of leads; and
  a molding compound on the leadframe, on the die, and on the plurality of wires.

4. The device of claim 3 wherein the molding compound being in the cavity.

5. The device of claim 1 further comprising:
  a second flange extending from a second outermost edge of the die pad and away from the first surface of the die pad, the second flange having a third portion coupled to the edge of the die pad and a fourth portion having a fourth surface, a plane of the fourth surface being at a second angle with respect to the first surface.

6. The device of claim 5 wherein the second angle of the fourth surface with respect to the first surface is substantially equivalent to the first angle of the third surface with respect to the first surface.

7. The device of claim 5 wherein the second angle of the fourth surface with respect to the first surface is different than the first angle of the third surface with respect to the first surface.

8. A device, comprising:
  a leadframe including:
    a plurality of leads;
    a die pad having a first surface bounded by an outermost edge of the die pad; and
    a plurality of anchoring posts extend outward from the first surface of the die pad, the anchoring posts are at the outermost edge and are spaced apart along the outermost edge of the die pad, the plurality of anchoring posts each having first and second portions on opposite sides of a central portion, a thickness of the first and second portions being greater than a thickness of the central portion, each of the second portions includes a second surface at an end of one of the plurality of anchoring posts, each of the central portions includes a curved surface that extends from the second surface to the first portion, and the second surfaces and the curved surfaces are coupled together at points that face the die pad.

9. The device of claim 8 wherein the anchoring posts are spaced apart equidistantly along the outermost edge of the die pad.

10. The device of claim 8 wherein the second surfaces are flat and planar.

11. The device of claim 10 wherein the second surface has a square shape.

12. The device of claim 8 further comprising:
a die coupled to the die pad;
one or more wires coupled between the die and the plurality of leads; and
a molding compound on the die, the wires, and the leadframe, the molding compound surrounding each of the plurality of anchoring posts.

13. A device, comprising:
a leadframe including:
a lead; and
a die pad including:
a mounting surface;
a die attach surface opposite to the mounting surface; and
an anchoring post on an outermost edge of the die pad, the anchoring post extends outward from the die attach surface, the anchoring post includes:
a first portion with a first thickness;
a second portion with a second thickness at an end of the anchoring post spaced apart from the die attach surface, the second portion having an end surface that is transverse to the die attach surface; and
a third portion with a third thickness, the third portion extends between the first portion and the second portion, the third thickness varies between the first thickness and the second thickness, the third portion includes a curved surface extending from the die attach surface of the die pad to the end surface of the second portion, the curved surface and the end surface converging at an edge;
a space extending from the edge to the die attach surface.

14. The device of claim 13 wherein the leadframe further includes:
a tie bar at a corner of the leadframe, the tie bar includes:
a first surface facing in a first direction;
a second surface opposite to the first surface and facing in a second direction opposite to the first direction;
a third surface facing in the first direction;
a fourth surface opposite to the third surface and facing in the second direction;
a first curved region extends between the first surface and the third surface; and
a second curved region extends between the second surface and the fourth surface.

15. The device of claim 13 wherein the die pad includes a curved surface that extends outward from an outermost edge of the mounting surface of the die pad, the curved surface extends from the mounting surface of the die pad to the anchoring post.

16. The device of claim 13 wherein the die pad includes a second surface that extends outward from an outermost edge of the mounting surface of the die pad, the second surface is transverse to the mounting surface.

17. The device of claim 16 further comprising:
a molding compound on the die attach surface, on the first surface of the anchoring post, and on the second surface of the die pad, the mounting surface being substantially flush with the molding compound.

18. The device of claim 13 further comprising:
a die coupled to the die attach surface of the die pad, the die is adjacent to the anchoring post; and
a molding compound on the die and on the leadframe, the molding compound surrounding the anchoring post and the die, the molding compound filling the space.

* * * * *